United States Patent
Wu

(10) Patent No.: US 10,383,233 B2
(45) Date of Patent: Aug. 13, 2019

(54) METHOD FOR UTILIZING SURFACE MOUNT TECHNOLOGY ON PLASTIC SUBSTRATES

(71) Applicant: Weiping Wu, Penang (MY)

(72) Inventor: Weiping Wu, Penang (MY)

(73) Assignee: JABIL INC., St. Petersburg, FL (US)

( * ) Notice: Subject to any disclaimer, the term of this patent is extended or adjusted under 35 U.S.C. 154(b) by 0 days.

(21) Appl. No.: 14/856,173

(22) Filed: Sep. 16, 2015

(65) Prior Publication Data

US 2017/0079139 A1   Mar. 16, 2017

(51) Int. Cl.
| | | |
|---|---|---|
| *H05K 3/10* | (2006.01) | |
| *H05K 1/18* | (2006.01) | |
| *H05K 3/18* | (2006.01) | |
| *H05K 3/38* | (2006.01) | |

(52) U.S. Cl.
CPC .............. *H05K 3/105* (2013.01); *H05K 1/181* (2013.01); *H05K 3/182* (2013.01); *H05K 3/381* (2013.01); *H05K 2201/09118* (2013.01); *H05K 2203/107* (2013.01)

(58) Field of Classification Search
CPC ........ H05K 3/105; H05K 3/182; H05K 3/381; H05K 2201/09118; H05K 2203/107; Y10T 29/49158; Y10T 29/4913
See application file for complete search history.

(56) References Cited

U.S. PATENT DOCUMENTS

| | | | | |
|---|---|---|---|---|
| 5,353,195 A * | 10/1994 | Fillion | ..................... | H01L 23/50 174/255 |
| 7,038,195 B2 * | 5/2006 | Kida | ................... | H01L 31/0203 250/239 |
| 2002/0076497 A1 * | 6/2002 | Chen | ...................... | H05K 3/184 427/304 |
| 2010/0006327 A1 * | 1/2010 | Yu | ......................... | H05K 1/0284 174/258 |
| 2010/0307799 A1 * | 12/2010 | Chiang | .................. | H05K 3/108 174/255 |
| 2012/0074094 A1 * | 3/2012 | Chiang | ............... | H01L 21/4846 216/18 |
| 2014/0062799 A1 * | 3/2014 | Sutherland | ........... | H01Q 1/2266 343/702 |

* cited by examiner

*Primary Examiner* — Peter Dungba Vo
*Assistant Examiner* — Jeffrey T Carley
(74) *Attorney, Agent, or Firm* — Thomas J. McWilliams; Barnes & Thornburg LLP

(57) ABSTRACT

A method for forming an electronic circuit on a molded plastic substrate. The method includes laser etching at least a portion of the molded plastic substrate; activating via laser selective plating the laser-etched portion of the molded plastic substrate to form one or more electrically conductive traces; placing at least two electrically conductive pads at predetermined positions along the one or more electrically conductive traces that maximize an amount of surface area contact between the at least two electrically conductive pads and the molded plastic substrate; and surface mounting an electrical component to the at least two electrically conductive pads using electrically conductive bonding material.

6 Claims, 11 Drawing Sheets

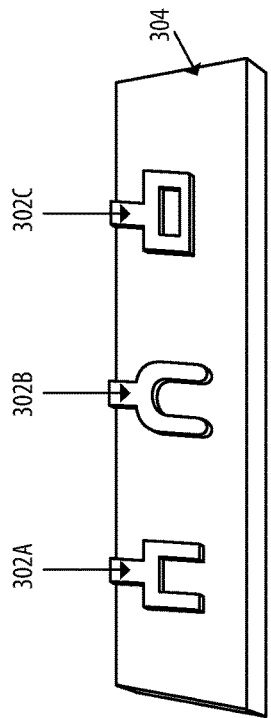
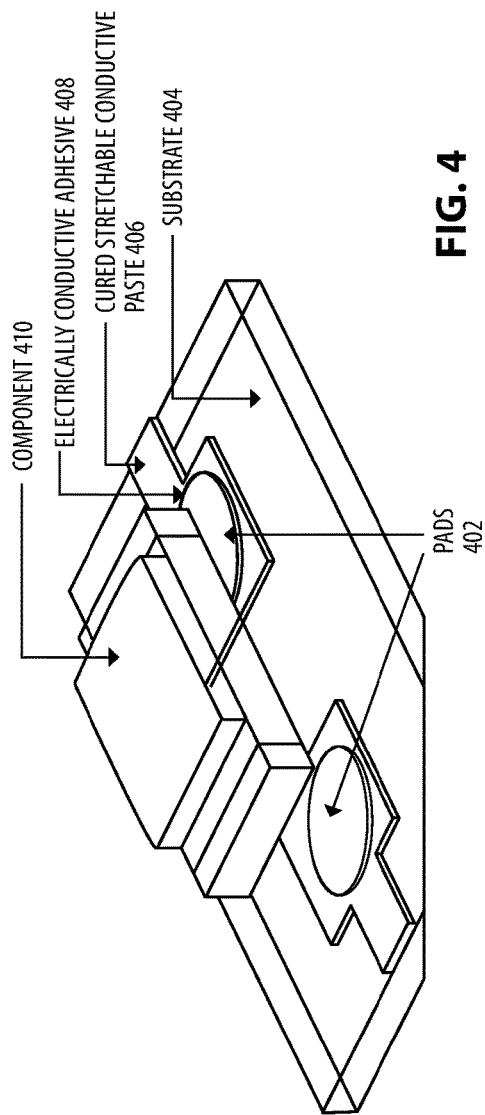
FIG. 3
FIG. 4

SMT on PCB pads

SMT on plastic substrate pads

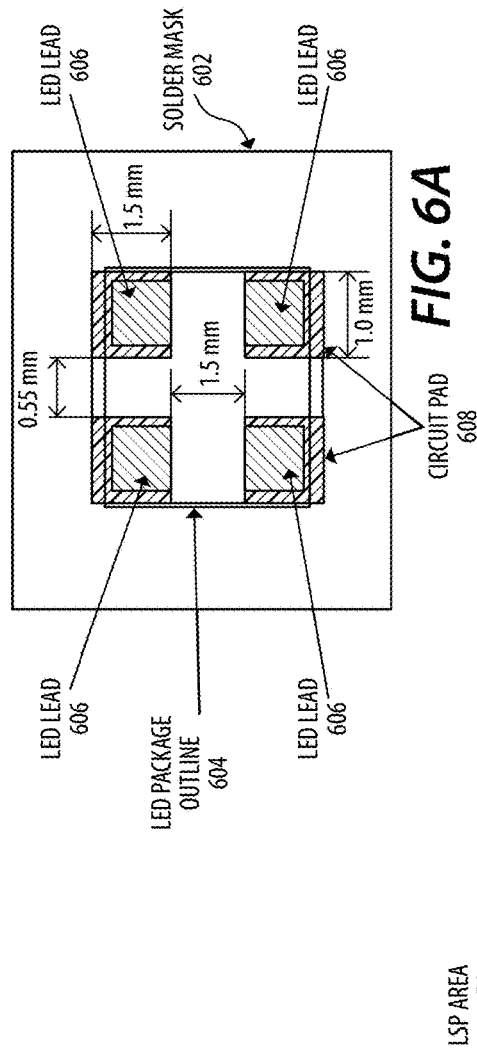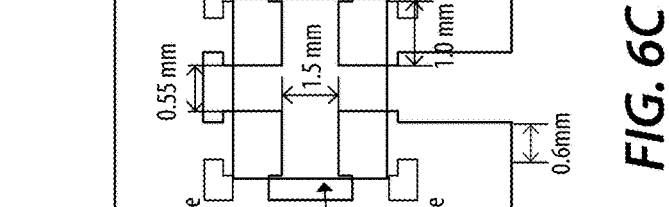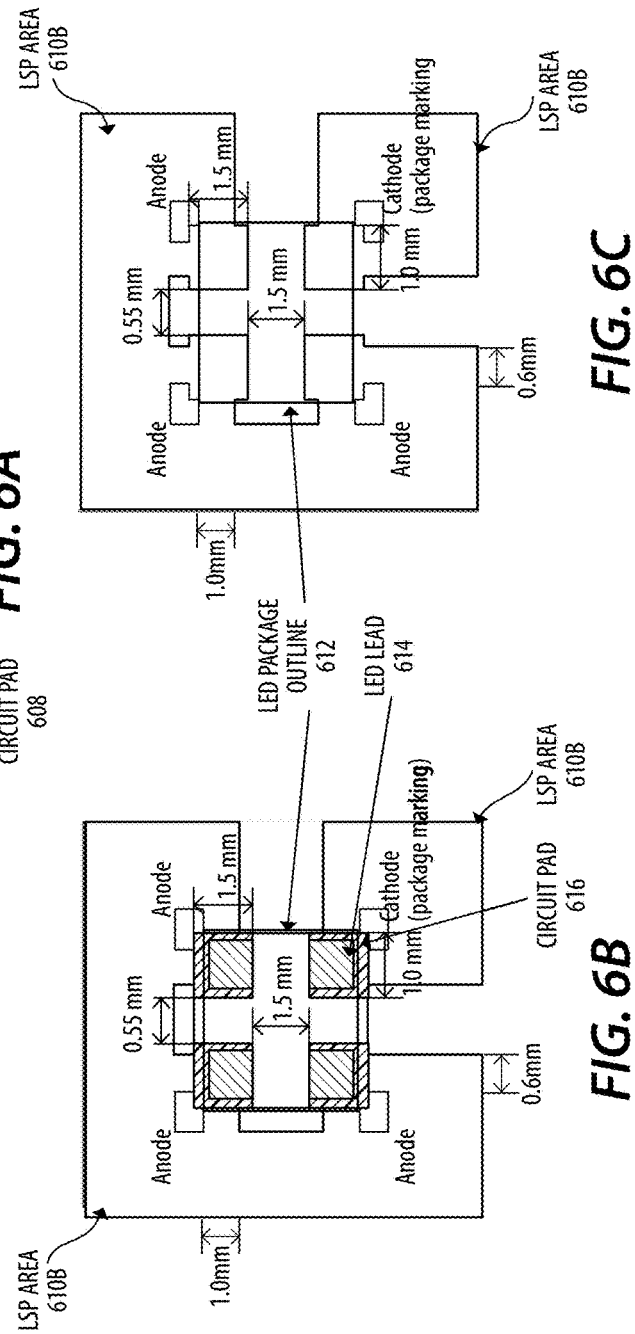

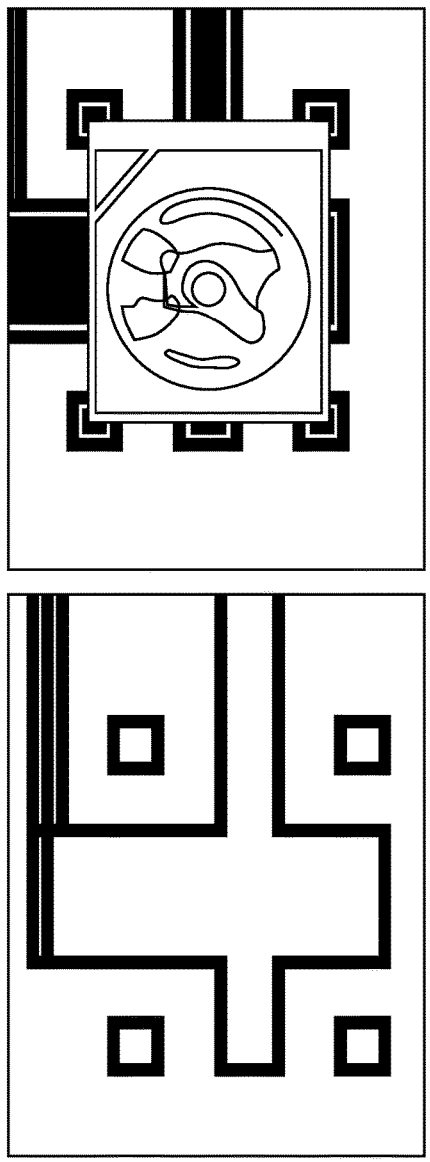
FIG. 7B
FIG. 7A
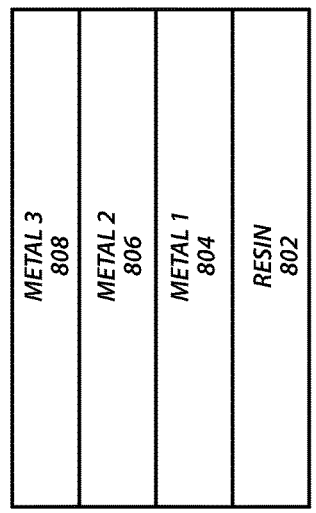
FIG. 8

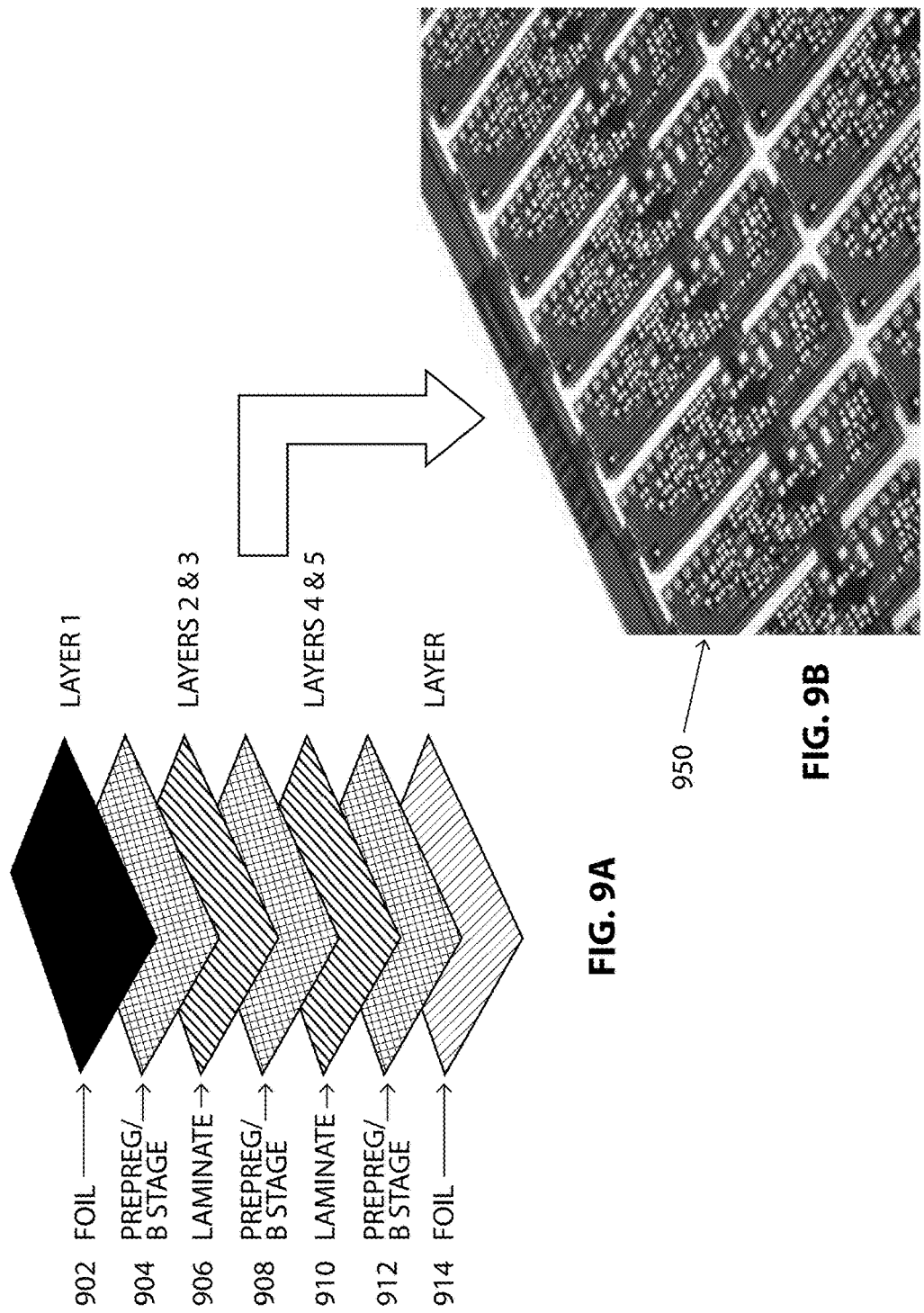

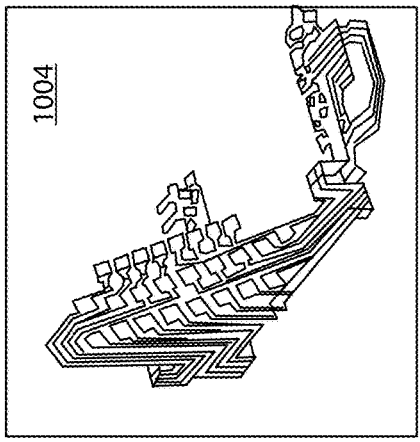
FIG. 10B
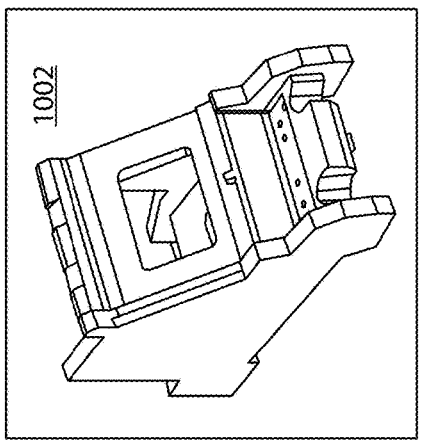
FIG. 10A
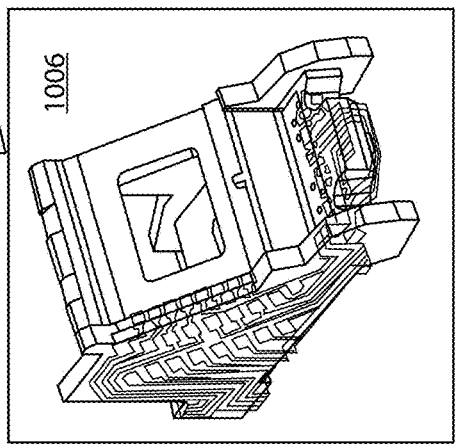
FIG. 10C

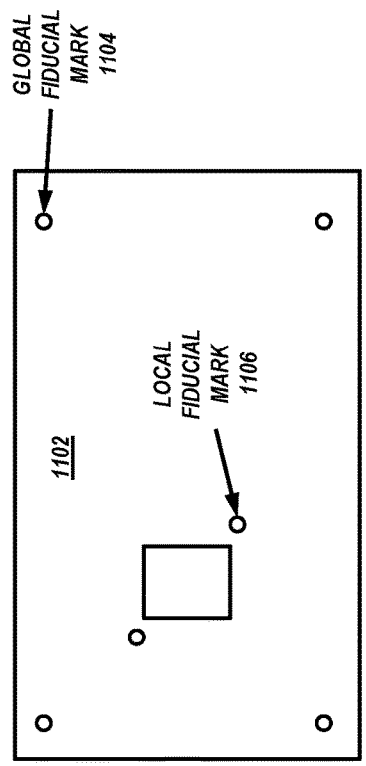
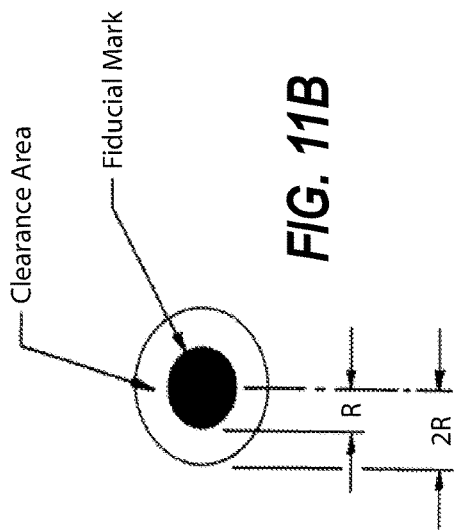
FIG. 11A
FIG. 11B

METHOD FOR UTILIZING SURFACE MOUNT TECHNOLOGY ON PLASTIC SUBSTRATES

BACKGROUND

Field of the Disclosure

The present disclosure relates to the formation of electronic circuitry for electronic devices and systems, and, more specifically, to forming multi-dimensional, such as 2-dimensional or 2.5-dimensional or 3-dimensional, molded interconnect devices (MID) for electronic devices and systems.

Description of the Background

As electronic and processing devices evolve, there is an increased need to miniaturize and integrate electronic components. Currently, many conventional device components are assembled using soldering techniques. For such techniques, components are generally soldered onto a rigid or flex printed circuit substrate to form a printed circuit board assembly (PCBA), with typical lead free process temperature ranges of 220 to 250° C. or more, or typical tin lead process temperature ranges of 180 to 220° C. Once the PCBA is formed, it is then attached or integrated into a device, a device portion or a product chassis, such as to form a final product.

With the advent of 3-dimensional (3D) printing and advanced plastic/thermoplastic molding techniques, devices or products of various and/or unique shapes, sizes and/or dimensions, often in relative miniature scale, are being fabricated, and these unique devices and products often require dedicated cavities, spaces and/or areas to accommodate the aforementioned PCBA circuitry. Among various drawbacks, such as the at least partially inflexible nature of most conventional PCBA circuitry arrangements, the insertion of electronics to these devices may carry a significant cost in space requirements that is highly undesirable because of the referenced unique and often miniature nature of these products and devices.

Accordingly, improved apparatuses, systems and methods of forming and integrating circuitry and electronics into electronic devices and/or systems are needed.

SUMMARY

Accordingly, in exemplary embodiments, a system and method is disclosed for forming an electronic circuit on a molded plastic substrate, comprising laser etching at least a portion of the molded plastic substrate; activating and plating the laser-etched portion of the molded plastic substrate to form one or more electrically conductive traces; placing at least one electrically conductive pad at one or more predetermined positions at the one or more electrically conductive traces; and surface mounting an electrical component to the at least one electrically conductive pad using -conductive bonding material (i.e. electronically conductive adhesive or solder etc).

In embodiments, an electronic circuit is disclosed, comprising a molded, multi-dimensional, such as 2.5-dimensional or three-dimensional, plastic substrate comprising one or more electrically conductive traces comprising plating that is formed on a laser-etched, activated portion of the molded plastic substrate defining each electrically conductive trace; one or more electrically conductive pads placed at one or more predetermined positions at the one or more electrically conductive traces; and an electrical component surface mounted to the at least one electrically conductive pad using conductive bonding material.

In further embodiments, an electronic device is disclosed comprising a multi-dimensional, such as a 2.5-dimensional or three-dimensional, electronic circuit formed to the shape of the electronic device, comprising: a multi-dimensional molded plastic substrate comprising one or more electrically conductive traces comprising plating that is formed on a laser-etched, activated portion of the molded plastic substrate defining each electrically conductive trace; one or more electrically conductive pads placed at one or more predetermined positions at the one or more electrically conductive traces; and an electrical component surface mounted to the at least one electrically conductive pad using conductive bonding material.

BRIEF DESCRIPTION OF THE FIGURES

The present disclosure will become more fully understood from the detailed description given herein below and the accompanying drawings which are given by way of illustration only, and which thus do not limit the present disclosure, and wherein:

FIG. 3 shows various pad configurations to allow electrically conductive adhesive applications to contact pad and molded plastic substrate under illustrative embodiments;

FIG. 4 shows a pad configuration and design pattern for a component coupled to a substrate between conductive pads using electronically conductive adhesive under an illustrative embodiment;

FIGS. 6A-6C show component pad layout for SMT on PCB, plastic and a LSP layer under illustrative embodiments;

FIGS. 7A-7B show component pad layouts on molded plastic substrates under illustrative embodiments;

FIG. 8 show a surface finish/plating structure for a substrate under an illustrative embodiment;

FIGS. 9A-9B show a fabrication layer configuration for a printed circuit board arrangement under an illustrative embodiment;

FIGS. 10A-10C shows a simplified combination of a circuit and a 3D molded plastic shape to form a 3D molded interconnection device;

FIGS. 11A-11B show fiducial arrangements and clearances for a circuit board under an illustrative embodiment.

DETAILED DESCRIPTION

Figure 1:
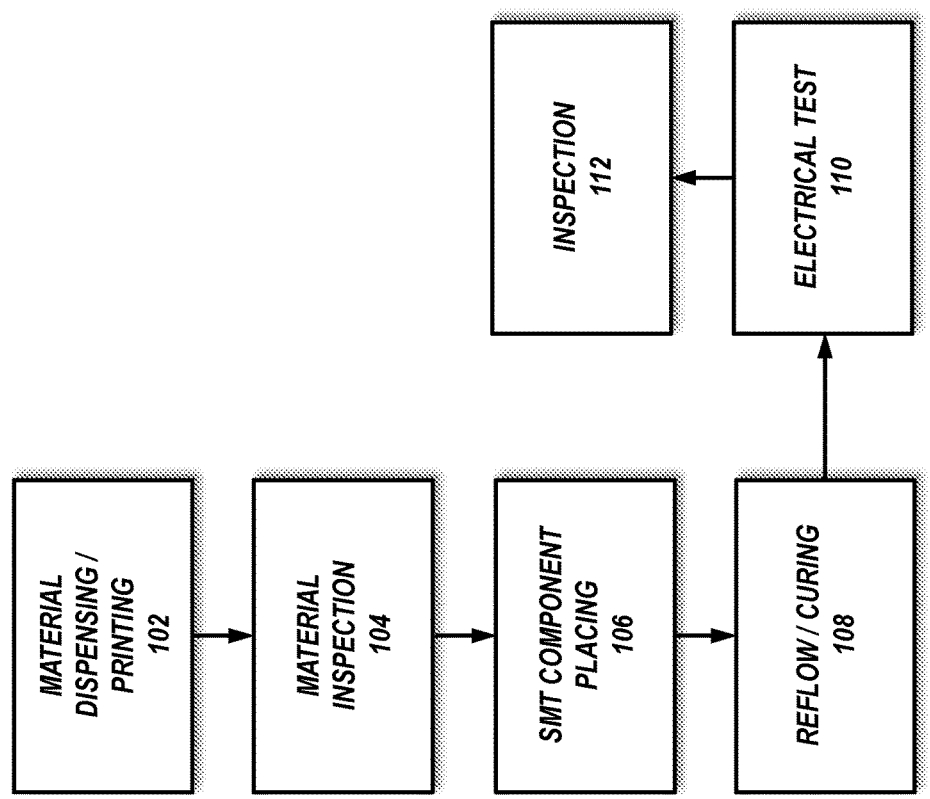
FIG. 1 shows a representative assembly process flow for manufacturing a molded interconnection device (MID) utilizing surface mount technology (SMT) under an illustrative embodiment.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, a discussion of such elements and operations may not be provided herein. However, the present disclosure is deemed to nevertheless include all such elements, variations, and modifications to the described aspects that would be known to those of ordinary skill in the art.

Exemplary embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that specific disclosed details need not be employed, and that exemplary embodiments may be embodied in different forms. As such, the exemplary embodiments should not be construed to limit the scope of the disclosure. In some exemplary embodiments, well-known processes, well-known device structures, and well-known technologies may not be described in detail.

The terminology used herein is for the purpose of describing particular exemplary embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the exemplary embodiments.

Various configurations disclosed herein illustrate techniques and technologies for providing electronics product assemblies utilizing Surface Mounting Technology (SMT) components that are placed onto one or more molded plastic substrates to form electronic circuits. In certain illustrative embodiments, thermoplastics and their structured metallization may be applied in circuit carrier design by injection-molding thermoplastic parts with integrated circuit tracers/pads to form multi-dimensional, such as 2.5-dimensional or 3-dimensional, Molded Interconnect Devices (MID).

Turning now to FIG. 1, an assembly process flow is shown for manufacturing a MID utilizing SMT under an illustrative embodiment. In block 102, interconnect material deposition (i.e., dispensing/jetting and/or printing and/or pin transfer/stamping, or the like) is performed onto a MID structure. In an illustrative embodiment, the MID structure may be formed using injection molding and hot stamping/embossing and additive manufacturing/3D printing. In other illustrative embodiments, the MID structure may be formed using two-shot injection molding and laser selective plating (LSP)/laser direct structuring (LDS)/laser subtractive structuring (LSS)/microscopic integrated processing technology (MIPTEC). Two-shot injection molding may include the use of two separate plastic parts, one platable and one non-platable, by way of non-limiting example. The platable part, which may be, for example, palladium doped plastic, may form the circuitry. The non-platable part, which may be, for example, polycarbonate, may fulfill mechanical functions and complete the molding. The two parts may be fused together and may then undergo, for example, electroless plating. In such a step, the platable plastic is metallized, while the non-platable plastic remains non-conductive.

In another illustrative embodiment, a MID structure of block 102 may be formed using laser selective plating (LSP) or laser direct structuring (LDS) or other technology, which may involve a multi-step process including injection molding, laser activation, and metallization. In an illustrative embodiment, a single thermoplastic material may be used to make a MID utilizing LSP, thereby making the molding step a one-shot process. In this example, the circuitry may be created on the plastic itself, since only one part is required. During laser activation, a physiochemical reaction may be performed using a laser to etch a wiring pattern onto the molded part and prepare it for metallization.

In illustrative embodiments, the molded plastic part may be made, for example, from an LDS-grade, Panasonic MIPTEC grade material, which includes, but is not limited to, variants of common plastics, such as nylon or acrylonitrile-butadiene-styrene (ABS) or liquid crystal polymer (LCP), that may be doped with a metal-organic compound. Other illustrative LDS-grade materials may include polycarbonate material, a blend of polycarbonate and acrylonitrile butadiene styrene (PC/ABS), polybutylene terephthalate (PBT), polypropylene (PP) and a polyphthalamide/polyamide blend (PPA/PA), among others that will be understood to those skilled in the art in view of the discussion herein.

During formation of a MID, the molecular structure of an LDS grade or other similar technology thermoplastic may include nonconductive atoms surrounding a metal "seed" atom buried or embedded inside the material. When laser energy is applied to the surface of the part in such a circumstance, it breaks the nonconductive atoms away from the conductive "seed" atoms, exposing them and selectively activating the material for metallization. Laser-activated areas where conductive features are exposed will form a rough, micro-etched texture that is advantageously adapted for providing a strong mechanical bond for metallization, while the non-conductive portions will retain a smooth surface. LDS takes advantage of the benefits of electroless plating in order to metallize circuit traces and other conductive features. The makeup of the metallized aspect(s) may include a Cu/Ni/Au coating, which provides good conduction, adhesion, and surface finish/plating.

In other illustrative embodiments (such as those discussed below in connection with FIGS. 3, 6A-6C, 7-8), a MID structure of block 102 may be formed using laser selective plating (LSP). When using LSP process to form MID structure, during designing the electronics circuit, where possible, always consider larger size (i.e. 0603, 0805 or above) and pitch (i.e. 0.65 mm or above) components first. Coefficients of thermal expansion (CTE) compatibility should be considered when selecting a specific plastic substrate material.

In block 104, material inspection may be performed, either manually, or through the use of machine-vision technologies. Once inspection is successfully completed, the process of FIG. 1 may proceed to SMT component placement 106. Under an illustrative embodiment, electronically conductive adhesive (ECA) is used to attach SMT components onto the plastic substrate in a low temperature environment (e.g., for polycarbonate (PC) material attachment may take place in temperatures below 200° C. and preferably at or below 115° C.). ECA's may include composites of adhesive resins with conductive fillers (e.g., silver flakes). The adhesive pastes may be configured to have low electrical conductivity before cure, and may become highly conductive only after the adhesives are cured and solidified. ECA s possess many advantages over conventional soldering, such as environmental friendliness, finer pitch printing, lower temperature processing and more flexible and simpler processing. For regular/high temperature plastic substrate assembly, low/regular melting point solder paste material and online reflow technology may be used for the component-substrate bonding process.

In an illustrative embodiment, such as for a 2D MID structure, conventional SMT machinery may employ typical SMT pick and place processes at step 106. For a 2.5D or 3D MID structure, special 3D capable placement machinery may be employed.

For component metallization, materials such as gold (Au), silver (Ag), silver-palladium (Ag—Pd) and the like may be used for product application under low-temperature conditions (e.g., 114° C. and below for polycarbonate, such as PC plastic material). Plating (e.g., tin plating) may be used for higher temperature plastic substrate product application (generally high temperature plastics have a permanent operating temperature of more than 150° C.).

Once SMT component placement is determined in block 106, reflow and/or curing processes (if necessary) are performed in block 108, followed by electrical testing 110 and inspection in block 112. Inspection 112 may occur manually or automatically, such as using machine-vision technologies. Additionally, other structural and/or mechanical inspections may be made independently or in combination with other inspection techniques.

Figure 2:
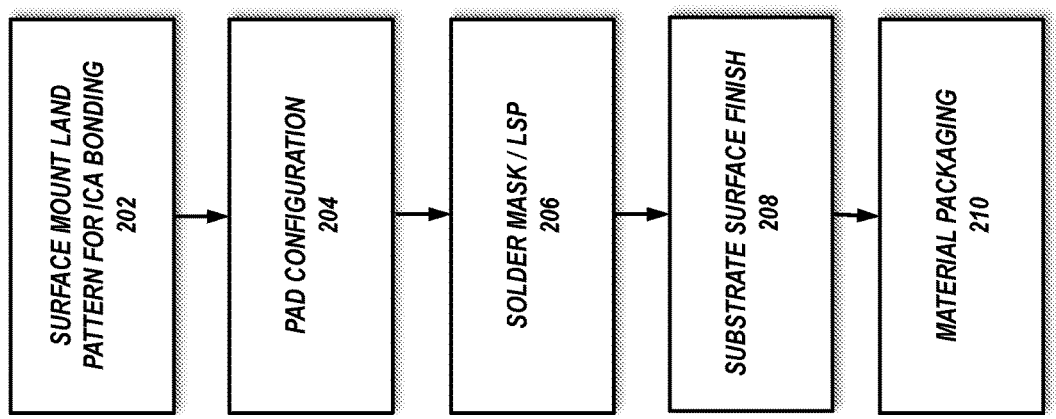
FIG. 2 shows a process flow for surface preparation and handling of laser selective plating (LSP) under an illustrative embodiment.

Turning now to FIG. 2, a process is shown for surface preparation and handling of LSP under an illustrative embodiment. In block 202, surface mount land pattern(s) for electrically conductive adhesive (ECA) bonding are determined, followed by a pad configuration 204 for the determined pattern. In order to provide desired bond strength and adhesion and to increase reliability of the attachment of components, specific pad layouts on the molded plastic substrate may be designed to increase and/or maximize the amount of plastic substrate and pad surface area contact. Such a configuration should promote stronger bonding through mechanical and chemical bonds, and also may help to absorb at least some forces created by potential mismatches of CTE between the traces, substrate, electrically conductive adhesive bonding material and the component terminals. Various pad configurations are shown in FIG. 3, in which different example pads (302A-302C) are shown on a plastic substrate 304 under illustrative embodiments. It should be understood by those skilled in the art that other pad configurations/geometries are contemplated in the present disclosure to allow adhesive bonding application to contact pads and the molded plastic substrate.

Figure 5A:
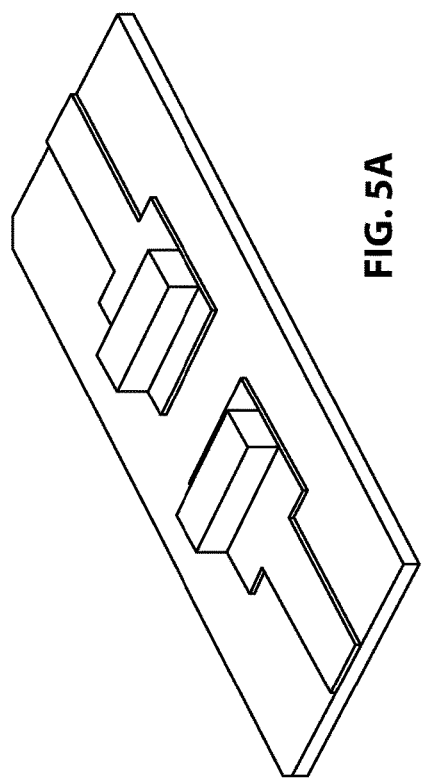
FIGS. 5A-5B show SMT land configurations for components on PCB versus plastic under an illustrative embodiment.
Figure 5B:
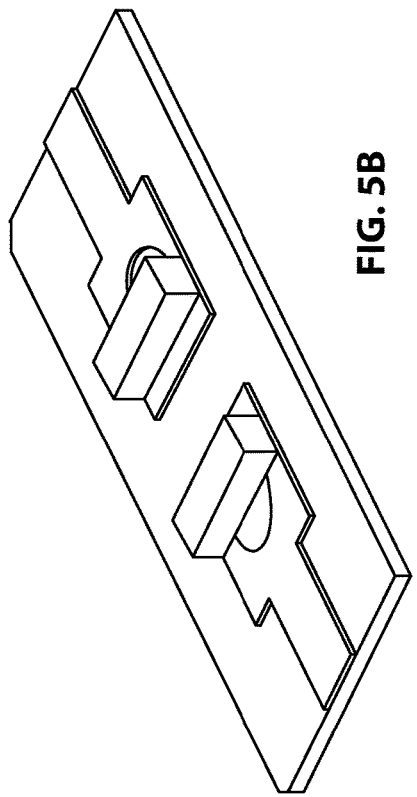

During interconnect material deposition 102, oversize ECA deposition (see FIGS. 6A-6C) may allow the ECA to bond directly to the plastic substrate, LSP and the component leads. ECA bonding to the plastic substrate may enhance the joint strength due to the chemical bonding between the two organic materials, e.g., ECA and PC ABS substrate (resin). FIG. 4 shows an illustrative configuration wherein pads 406 with recesses or cavity 402 are bonded to substrate 404, and are electrically bonded to component 410 (e.g., LED) using an electrically conductive adhesive 408 applied over a pad. FIGS. 5A and 5B show comparative illustrative examples of a SMT placement on PCB pads (FIG. 5A) compared to a SMT placement on plastic substrate pads (FIG. 5B).

In certain illustrative embodiments, the electrically conductive adhesive material may be configured to have substantially the same conductivity in all directions, such as wherein, in an illustrative embodiment, the ECA material may be composed of a polymer with Ag filler. The conductive adhesive bonding process may include printing or/and dispensing/jetting or pin transfer/stamping the conductive adhesive material on pads of a substrate. Components may then be aligned and mounted onto a substrate and the polymer resin in the conductive adhesive may cure through thermal compression to bond the component to the substrate. At substantially the same time, conductive filler in the conductive adhesive may form an electrically conductive path between the component and the substrate. In one illustrative embodiment, an underfill or globaltop may be applied between the component and the substrate, such as for sealing and protection.

Generally speaking, ECA material in the present disclosure may possess good electrical properties similar to solder material (e.g., volume resistivity: <0.001 Ohm/CM) and suitable thermal properties and thermal dissipation (e.g., thermal conductivity >2.5 W/m K). In certain illustrative embodiments, the ECA material should have no impact on RF performance (e.g. for antenna application), should possess good chemical resistance and good ductility, and should have chemical compatibility with plastic substrate material. In certain illustrative embodiments, the ECA material may be suitable for NiAu surface finish on PC plastic substrate, and Sn metallization at a component level (e.g., bonding Sn metallization SMT components to NiAu surface finish on plastic substrate). The ECA material may be configured with a low curing temperature (e.g. <100° C.) having a short curing time, and may be applied either by dispensing/jetting (e.g., syringe packaging) or screen printing or pin transfer/stamping applications, for example.

Referring back to FIG. 2, a LSP/plating process may be performed at block 206, also described in greater detail in relation to FIGS. 6A-6C. Shown are configurations for preparing a surface for bonding one or more components, which, in illustrative embodiments, are shown as LED devices. Of course, those skilled in the art will appreciate that the present disclosure contemplates the bonding of any suitable component. Furthermore, the dimensions shown in the figures are merely provided as illustrative points of reference regarding component layout sizes and dimensions, and are not intended to limit the present disclosure in any way.

FIG. 6A illustrates an LED pad layout for SMT on a PCB, wherein a solder mask 602 is applied at outside of the component package (e.g., LED package), outlined as 604 in FIG. 6A in an embodiment. Component package outline 604 may include one or more circuit pads 608 configured to accommodate component (e.g., LED) leads 606. FIGS. 6B-6C illustrate an LED pad layout, wherein FIG. 6B shows an LED pad layout for SMT on plastic, while FIG. 6C shows only an LSP layer of the LED pad layout for SMT on plastic, in illustrative embodiments. As can be seen from FIG. 6B, one or more LSP area layouts (610A-610B) may be arranged, wherein a first portion may be arranged for an anode (610A), while a second portion (610B) may be arranged for a cathode. Once a LSP layer is established (610B), the circuit pad(s) 616 for component (LED) lead(s) 614 may be placed for a package outline area 612. FIGS. 7A-7B show photographic depictions of component pad layouts on molded plastic substrates under illustrative embodiments.

Figure 6D:
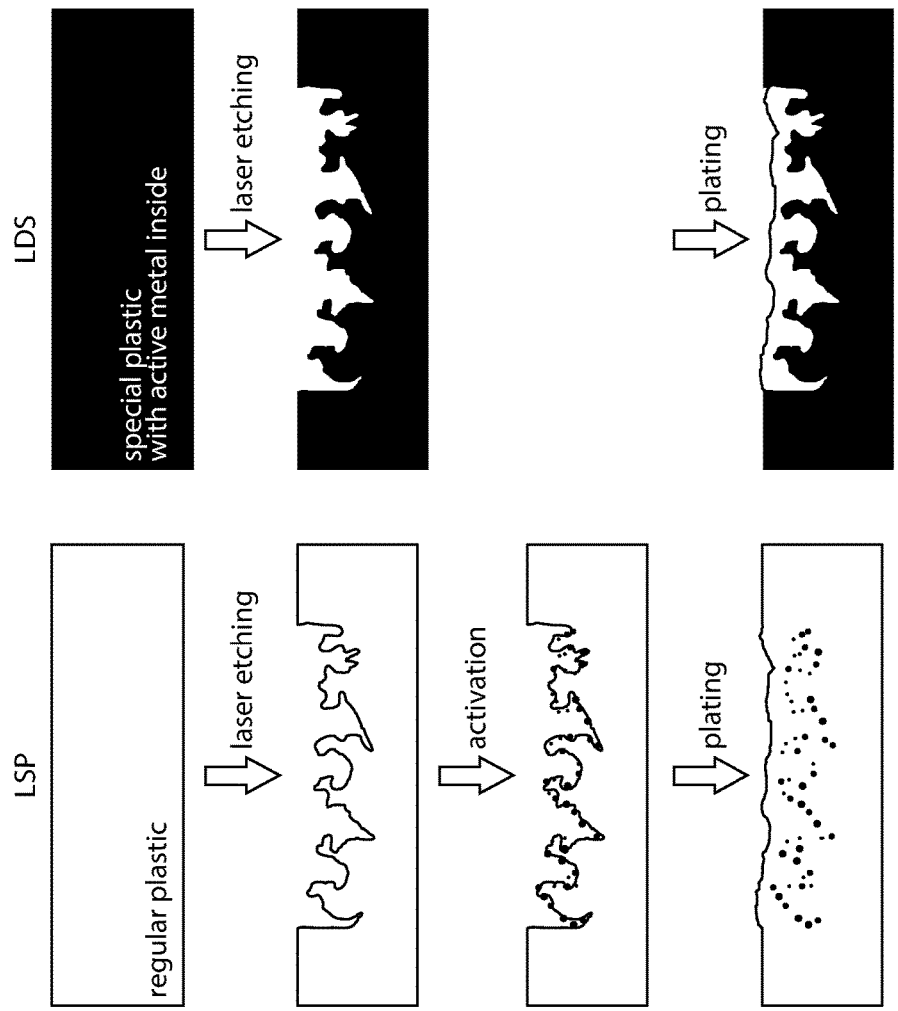
FIG. 6D shows a comparison between an LSP process and other similar technology process under an illustrative embodiment.
Figure 12C:
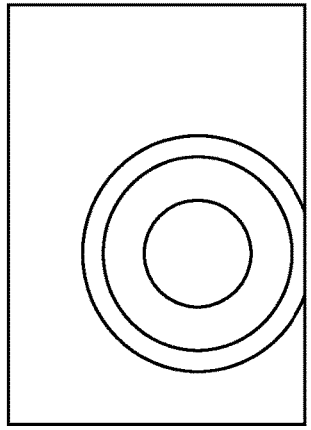
FIGS. 12A-12F show various examples of fiducial marks for a circuit board under illustrative embodiments.
Figure 12B:
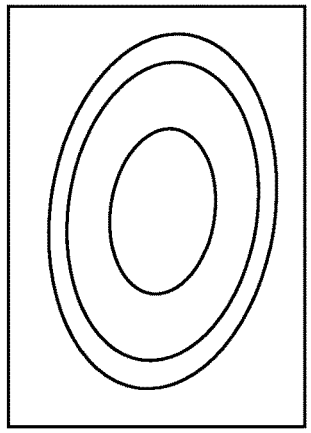
Figure 12A:
Figure 12F:
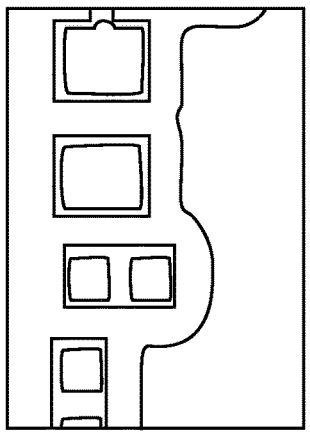
Figure 12E:
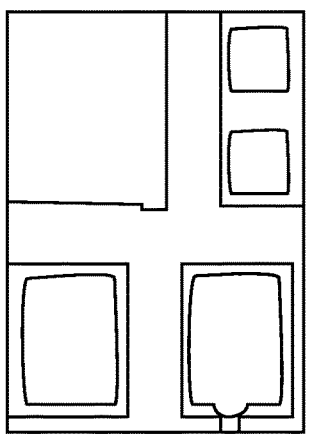
Figure 12D:
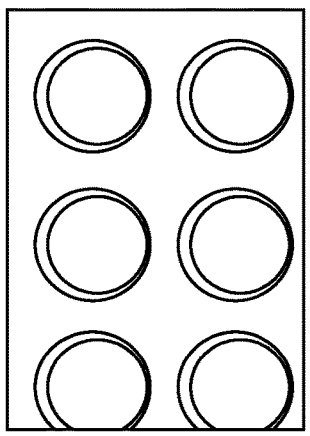

A solder mask layer may be applied to cover copper traces to protect against corrosion, electrical short, avoid oxidation and environmental influences. If a solder mask is not applied, then the pad configuration design may be reconsidered. For bonding pads, test points and fiducial marks may or may not be required. Moreover, a silkscreen may be applied as a reference designator and pin marker for each SMT component designed for the plastic substrate, The LSP process disclosed herein provides certain advantages over other similar technology, and is illustrated in FIG. 6D in an exemplary embodiment. Although known methods may require special plastics with active metal, LSP may be performed on typical plastics. Accordingly, after laser etching, the etched portion may be coated with catalytic material ("seed") during an activation process, wherein plating is subsequently performed. Since LSP does not require the use of specialized activated plastics, LSP may be applied in a wider variety of applications and in a more flexible environment.

Once the LSP/plating are performed in block 206 of FIG. 2, a substrate solder mask process is performed in block 208, which may be followed by material packaging in block 210 to protect the formed MID. For the substrate surface finish/plating process of block 206, a surface finish/plating layer may be applied, and FIG. 8 shows a multi-layer surface finish structure under an illustrative embodiment. In this example, a resin 802 may be layered with a plurality of metals 804-808 that may include copper (Cu), nickel (Ni) and/or gold (Au), among others. In some illustrative embodiments, electroless Nickel/Immersion Gold (ENIG) may be used for the molded low temperature plastic substrate. For lower cost applications, Organic Solderability Preservative (OSP) may be used for molded high/regular temperature plastic substrate configurations. Preferably, smooth, glossy plating should be used instead of matte surface finishes, as rough plating surfaces may form inconsistent intermetallic compound thickness which may affect bonding reliability performance.

For the metallic layers of FIG. 8, each successive layer (starting from layer 804 to layer 808) may be configured to have a successively thinner layer to accommodate the specific metallic properties of each layer. For example, utilizing a copper layer as layer 804, copper thickness and dimension may be evaluated from an early stage to meet end product specific application requirement, e.g., thicker and larger copper dimension may be required for better thermal dissipation for high power product application. In an exemplary embodiment, electroless nickel as layer 806, and gold as layer 808, may be configured having target thicknesses of 10~18 µm for copper layer 804, 3~6 µm for nickel layer 806, and 0.1~0.3 µm for gold layer 808. Of course, one skilled in the art will recognize that these thicknesses are illustrative and non-limiting, and that a myriad of different thicknesses and metals may be used. Further, for wire bonding on a MID structure, soft surface finish/plating, i.e., ENEPIG, may be considered.

FIGS. 9A-9B show a configuration for layering materials for forming a printed circuit board 950 under an illustrative embodiment. In this example, the layers may include a base foil layer 902 that has one or more pre-impregnated composite fiber ("prepreg") layers (904, 908, 912) sandwiched between one or more laminate layers (906, 910). Under an illustrative embodiment, the prepreg layers may include a matrix material, such as epoxy, that may take the form of a weave and the matrix is used to bond layers together and/or to other components, such as layers 906, 910, during manufacture. The matrix may be partially cured to allow easier handling ("B-Stage") material and may be configured to undergo polymerization under heat (e.g., using oven or autoclave). The composite fiber (904, 908, 912) and laminate (906, 910) layers may then be covered in a covering foil layer 914. In certain illustrative embodiments, laminate (906, 910) may include a glass resin and may further include signal and/or power planes etched on either or both sides. The foil layers (902, 914) may be configured as a metallic (e.g., copper) foil.

The layered configuration of FIG. 9A may then be cut, bent, shaped, etc. and subjected to surface finish/plating and solder mask processing to form a printed circuit board 950 as shown in FIG. 9B. As illustrated in FIGS. 10A-10C, a mold 1002 for a device may be formed while a complimentary circuit arrangement 1004 is formed using any of the techniques described herein. The circuit arrangement 1004 can be achieved via LSP or other technology onto the mold 1002 to form a completed mold circuit 1006

In some illustrative embodiments, manufacturing and/or inspection of SMT on plastic device or MID under the present disclosure may occur by way of automated machinery. Accordingly, there may also be a need for creating fiducial markers ("fiducials"). Generally speaking, a fiducial mark, or simply a fiducial, is an object created or placed in the field of view of an imaging system and which appears in the image produced, such as for use as a point of reference or a measure. It may be either something placed into or on the imaging subject, or a mark or set of marks in the reticle of an optical instrument. Fiducial marks may be configured to allow SMT placement equipment to accurately locate and place components on a plastic substrate/MID. These devices may be configured to locate the circuit pattern by providing common measurable points. In certain illustrative embodiments, fiducials may be made by leaving a circular area of the substrate bare from solder-mask coating. Inside this area may be a circle exposing the metal plating beneath. This center metallic disc can be solder-coated, gold-plated or otherwise treated.

Placement machines may be configured to feed a substrate for assembly by a rail conveyor or robot/gripper, with the substrate being clamped down or gripped respectively then move in the assembly area of the machine. Each substrate may clamp or grip slightly differently than the others, and the variance (which may generally be only tenths of a millimeter) may be sufficient to ruin a board without proper calibration. Accordingly, a substrate may be configured to have multiple fiducials to allow placement robots to precisely determine the substrate's orientation. By measuring the location of the fiducials relative to the substrate plan stored in the machine's memory, the machine can reliably compute the degree to which parts must be moved relative to the plan ("offset") to ensure accurate placement.

FIG. 11A shows an illustrative embodiment for a SMT on plastic substrate board/MID structure 1102 configured with global fiducial marks 1104 and local fiducial marks 1106. FIG. 11B shows a clearance area used relative to a fiducial mark under an illustrative embodiment. In certain illustrative embodiments, global fiducials (1104) may be located on a three point grid based system, with the lower left fiducial located at the 0,0 datum point and the other two fiducials located in the positive X and Y directions. Fine pitch components may have two local fiducials (when necessary) designed into the land pattern of the component. This may allow for correction of translational offsets (x and y position) and rotational offsets (theta position). In an illustrative embodiment, there can be two marks located diagonally opposed within the perimeter of the land pattern.

In certain illustrative embodiments, each fiducial mark is a solid filled circle. Fiducials may have a solder mask opening large enough to provide good contrast and be free of solder mask to enable accurate identification by all vision alignment systems. In certain illustrative embodiments, a minimum diameter of the fiducial mark may be 1 mm and the maximum at 3 mm. Fiducial marks located on the same substrate should preferably not vary in size by more than 25 µm. Clearance areas (FIG. 11B) may be devoid of other circuit features or markings and should be maintained around the fiducial mark. In certain illustrative embodiments, the size of the clear area may be equal to the radius of the fiducial mark. One exemplary clearance around the mark is equal to the mark diameter.

In certain illustrative embodiments, the fiducial may be bare or covered copper, protected by a clear anti-oxidation coating, may be nickel or tin plated, or solder coated (HASL), by way of example. An exemplary thickness of the plating or solder coating is 5 to 10 µm. Solder coating may, for example, not exceed 25 µm. If solder mask(s) are used, they may not cover the fiducial or the clearance area, and the flatness of the surface of the fiducial mark may be within 15 µm. For improved performance, there may be a high degree of contrast between the surface of the fiducial mark and the adjacent molded plastic substrate material.

Under the present disclosure, users may be able to assemble SMT components directly onto (low temperature) 3D structures, such as plastic substrates, to form a final product and enable integration of mechanical and electronic functions into a single device. Other advantages include, but are not limited to, enabling device miniaturization, integration, rationalization and feature advancement; providing shape flexibility and hybrid configurations that may shorten process chains; providing greater design flexibility to further improve portability and functionality; providing the ability to create antenna structures on a 3D surface, increasing the quality of the signal by using a bigger or better circuit pattern(s); and reducing number of parts and substrates and total assembly time through integration. The present disclosure further has a wide variety of industry applications, including, but not limited to, antenna applications, automotive lighting applications, consumer applications (e.g., intrusion-detection circuits, RFID transponder, wireless chargers, power transmission touch sensors, camera module, wristband/fitness ring, etc.), medical and health care devices (e.g. hearing aids, pharma pen, etc), industrial applications (e.g., sensors, power controllers, battery containers, switching modules, OLED, etc.), and microelectronics.

In the foregoing detailed description, it can be seen that various features are grouped together in individual embodiments for the purpose of brevity in the disclosure. This method of disclosure is not to be interpreted as reflecting an intention that the subsequently claimed embodiments require more features than are expressly recited in each claim.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather are to be accorded the widest scope consistent with the principles and novel features disclosed herein.

What is claimed is:

1. A method for forming an electronic circuit on a two-shot injection molded plastic substrate, comprising:
using two-shot injection molding to form a first shot and a second shot of the two-shot injection molded plastic substrate, each shot being a separate plastic part;
laser etching at least a portion of the second shot of the two shot injection molded plastic substrate;
activating via laser selective gloss-plating of at least the laser-etched portion to form one or more electrically conductive traces;
placing at least two electrically conductive pads at predetermined positions along the one or more electrically conductive traces that maximize an amount of surface area contact between the at least two electrically conductive pads and the molded plastic substrate;
surface mounting an electrical component to the at least two electrically conductive pads using electrically conductive bonding material; and
mechanically supporting the second shot of the two shot injection molded plastic substrate having thereon the surface mounted electrical component via the first shot of the two shot injection molded plastic substrate, wherein the first shot of the two shot injection molded plastic substrate is formed of non-platable polycarbonate.

2. The method of claim 1, wherein the second shot of the two shot injection molded plastic substrate comprises a laser direct structuring or thermoplastic comprising nonconductive atoms surrounding an embedded conductive atom.

3. The method of claim 2, wherein the activating comprises solely applying laser energy to a surface of the laser-etched portion to break the nonconductive atoms away from the conductive atoms and expose the conductive atoms.

4. The method of claim 1, wherein the second shot of the two shot injection molded plastic substrate comprises a laser selective plating thermoplastic comprised only of nonconductive material.

5. The method of claim 4, wherein the activating comprises coating the laser-etched portion with a catalytic material.

6. The method of claim 1, wherein the second shot of the two shot injection molded plastic substrate comprises a substrate having a 2-dimensional, 2.5-dimensional or 3-dimensional shape.

\* \* \* \* \*